(12) United States Patent
Lee

(10) Patent No.: US 11,244,928 B2
(45) Date of Patent: Feb. 8, 2022

(54) STACKED TYPE SEMICONDUCTOR DEVICE INCLUDING THROUGH ELECTRODE

(71) Applicant: SK hynix Inc., Icheon-si (KR)

(72) Inventor: Nam Jae Lee, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 16/942,290

(22) Filed: Jul. 29, 2020

(65) Prior Publication Data

US 2021/0288028 A1 Sep. 16, 2021

(30) Foreign Application Priority Data

Mar. 12, 2020 (KR) ................. 10-2020-0030963

(51) Int. Cl.
| | | |
|---|---|---|
| *H01L 25/065* | (2006.01) | |
| *H01L 23/48* | (2006.01) | |
| *H01L 25/00* | (2006.01) | |
| *H01L 21/768* | (2006.01) | |

(52) U.S. Cl.
CPC .... *H01L 25/0657* (2013.01); *H01L 21/76898* (2013.01); *H01L 23/481* (2013.01); *H01L 25/50* (2013.01); *H01L 2225/06513* (2013.01); *H01L 2225/06544* (2013.01)

(58) Field of Classification Search
CPC combination set(s) only.
See application file for complete search history.

(56) References Cited

U.S. PATENT DOCUMENTS

| | | | |
|---|---|---|---|
| 9,443,796 B2 | 9/2016 | Chou et al. | |
| 9,960,142 B2 | 5/2018 | Chen et al. | |
| 2002/0030245 A1* | 3/2002 | Hanaoka | H01L 23/3107 257/621 |
| 2009/0008790 A1* | 1/2009 | Lee | H01L 23/481 257/774 |
| 2009/0261458 A1* | 10/2009 | Bae | H01L 23/49827 257/621 |
| 2010/0171209 A1* | 7/2010 | Tanie | H01L 24/13 257/686 |
| 2011/0058348 A1* | 3/2011 | Sakai | H01L 23/50 361/803 |
| 2011/0221044 A1* | 9/2011 | Danek | H01L 23/53238 257/621 |
| 2012/0028412 A1* | 2/2012 | Jeong | H01L 25/0657 438/107 |
| 2012/0214302 A1* | 8/2012 | Jeong | H01L 21/486 438/613 |
| 2012/0276733 A1* | 11/2012 | Saeki | H01L 21/76898 438/613 |
| 2012/0306095 A1* | 12/2012 | Han | H01L 23/481 257/774 |

(Continued)

*Primary Examiner* — Mamadou L Diallo
(74) *Attorney, Agent, or Firm* — William Park & Associates Ltd.

(57) ABSTRACT

There are provided a stacked type semiconductor device and a manufacturing method of the stacked type semiconductor device. The stacked type semiconductor device includes: semiconductor chips stacked to overlap with each other; through electrodes respectively penetrating the semiconductor chips, the through electrodes being bonded to each other; and empty gaps respectively buried in the through electrodes.

15 Claims, 18 Drawing Sheets

(56) References Cited

U.S. PATENT DOCUMENTS

| | | | | |
|---|---|---|---|---|
| 2013/0313687 A1* | 11/2013 | Bonkohara | ....... | H01L 21/76856 257/621 |
| 2014/0051189 A1* | 2/2014 | Kai-Jun | ................. | H01L 22/20 438/15 |
| 2014/0117556 A1* | 5/2014 | Lin | ..................... | H01L 25/0657 257/774 |
| 2014/0175614 A1* | 6/2014 | Wang | ................... | H01L 23/481 257/621 |
| 2014/0361426 A1* | 12/2014 | Moon | ..................... | H01L 24/96 257/737 |
| 2015/0041991 A1* | 2/2015 | Yamada | ............. | H01L 25/0657 257/774 |
| 2015/0262913 A1* | 9/2015 | Wakatsuki | ............. | H01L 24/05 257/737 |
| 2016/0351450 A1* | 12/2016 | Migita | ................. | H01L 23/481 |
| 2017/0018533 A1* | 1/2017 | Miki | ................... | H01L 23/3135 |
| 2017/0179056 A1* | 6/2017 | Schrems | ................ | H01L 23/31 |

\* cited by examiner

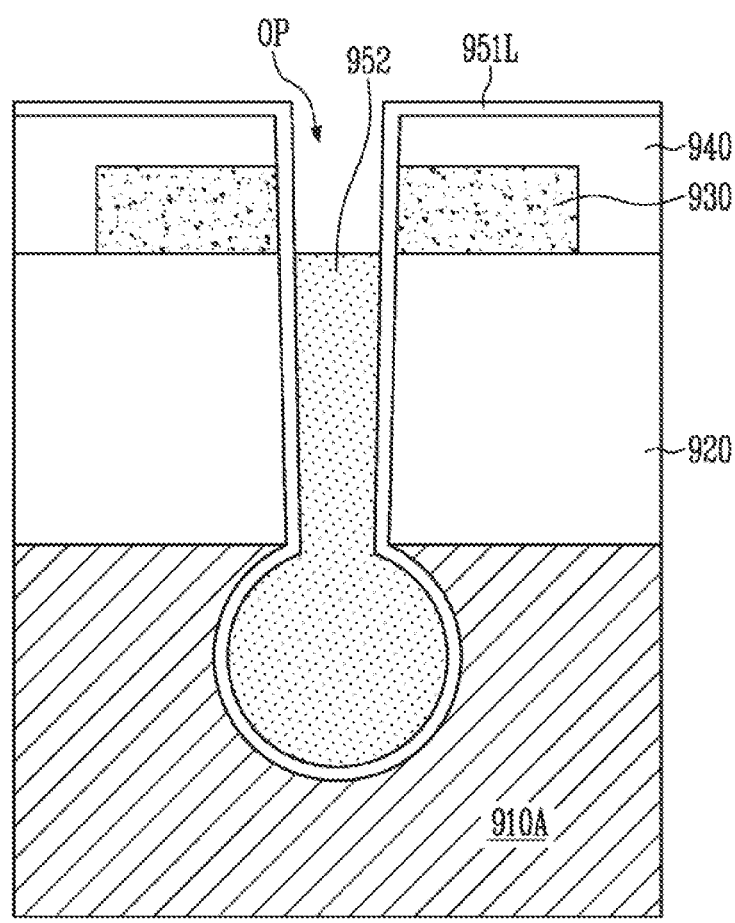

FIG. 10A
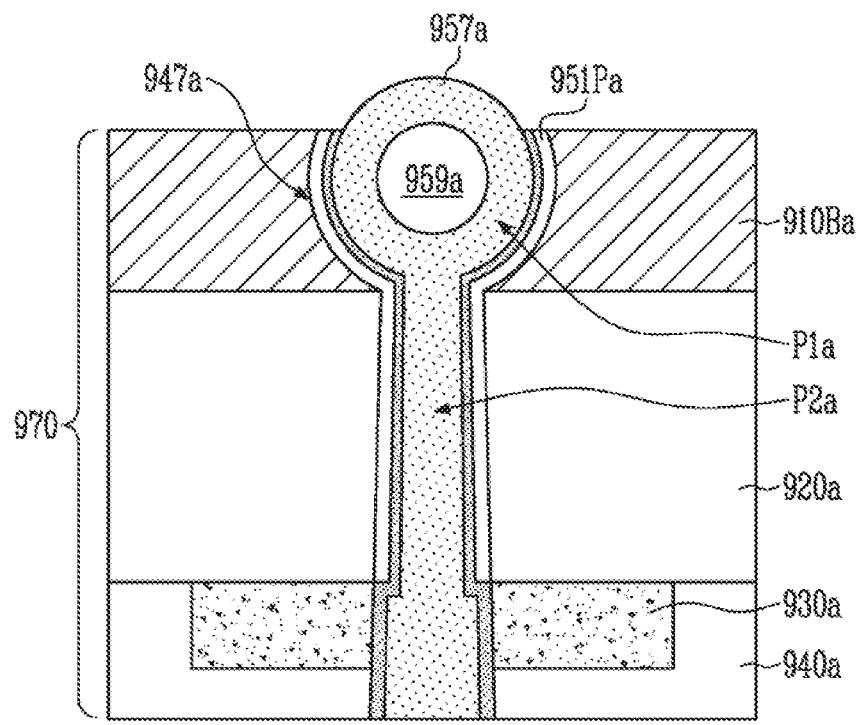
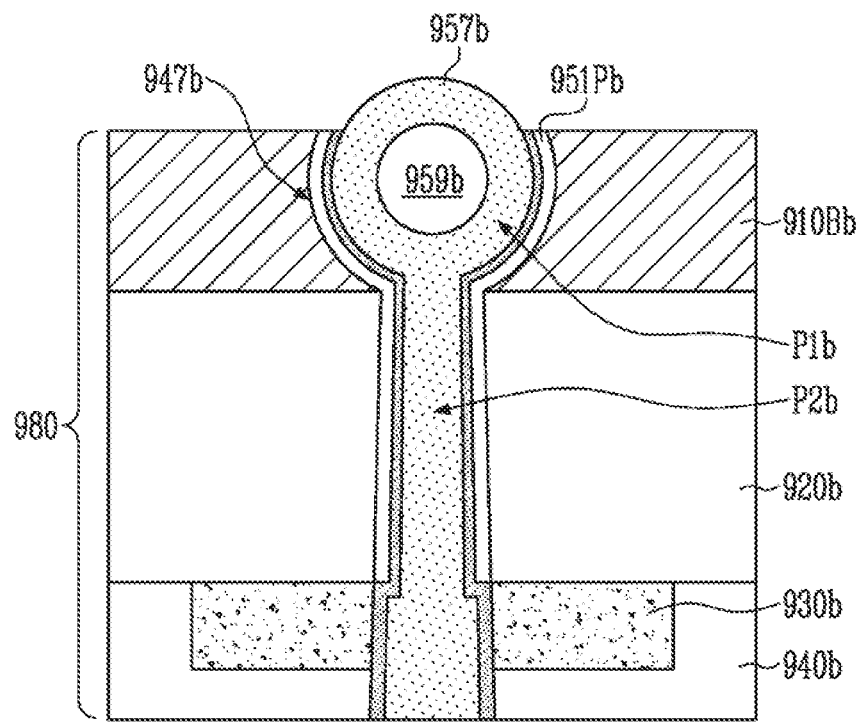

STACKED TYPE SEMICONDUCTOR DEVICE INCLUDING THROUGH ELECTRODE

CROSS-REFERENCE TO RELATED APPLICATION

The present application claims priority under 35 U.S.C. § 119(a) to Korean patent application number 10-2020-0030963, filed on Mar. 12, 2020, in the Korean Intellectual Property Office, the entire disclosure of which is incorporated herein by reference.

BACKGROUND

1. Technical Field

The present disclosure generally relates to a stacked type semiconductor device and a manufacturing method of the stacked type semiconductor device, and more particularly, to a stacked type semiconductor device including a through electrode and a manufacturing method of the stacked type semiconductor device.

2. Related Art

In a stacked type semiconductor device, semiconductor chips overlap with each other, so that the degree of integration of the semiconductor device can be improved. The semiconductor chips overlapping with each other may be electrically connected to each other through through electrodes. The through electrodes can decrease the length of an interconnection structure between the semiconductor chips overlapping with each other, and thus the semiconductor device having an improved data transmission speed can be provided.

SUMMARY

In accordance with an aspect of the present disclosure, there may be provided a stacked type semiconductor device including: semiconductor chips stacked to overlap with each other; through electrodes respectively penetrating the semiconductor chips, wherein the through electrodes are bonded to each other; and empty gaps respectively buried in the through electrodes.

In accordance with another aspect of the present disclosure, there may be provided a method of manufacturing a stacked type semiconductor device, the method including: forming a first semiconductor chip penetrated by a first through electrode in which a first empty gap is buried; forming a second semiconductor chip penetrated by a second through electrode in which a second empty gap is buried; aligning the first semiconductor chip on the second semiconductor chip; and bonding the first through electrode to the second through electrode.

BRIEF DESCRIPTION OF THE DRAWINGS

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

FIGS. 9A, 9B, 9C, 9D, 9E, 9F, 9G, 9H, 9I, 9J, 10A, and 10B are sectional views illustrating a manufacturing method of a stacked type semiconductor device in accordance with an embodiment of the present disclosure.

DETAILED DESCRIPTION

Specific structural or functional descriptions disclosed herein are merely illustrative for the purpose of describing embodiments according to the concept of the present disclosure. Embodiments according to the concept of the present disclosure can be implemented in various forms, and should not be construed as limited to the embodiments set forth herein.

Hereinafter, the terms 'first' and 'second' are used to distinguish one component from another component. For example, a first component may be referred to as a second component without departing from a scope in accordance with the concept of the present disclosure and similarly, a second component may be referred to as a first component.

Embodiments provide a stacked type semiconductor device capable of improving the stability of a bonding structure, and a manufacturing method of the stacked type semiconductor device.

Figure 1:
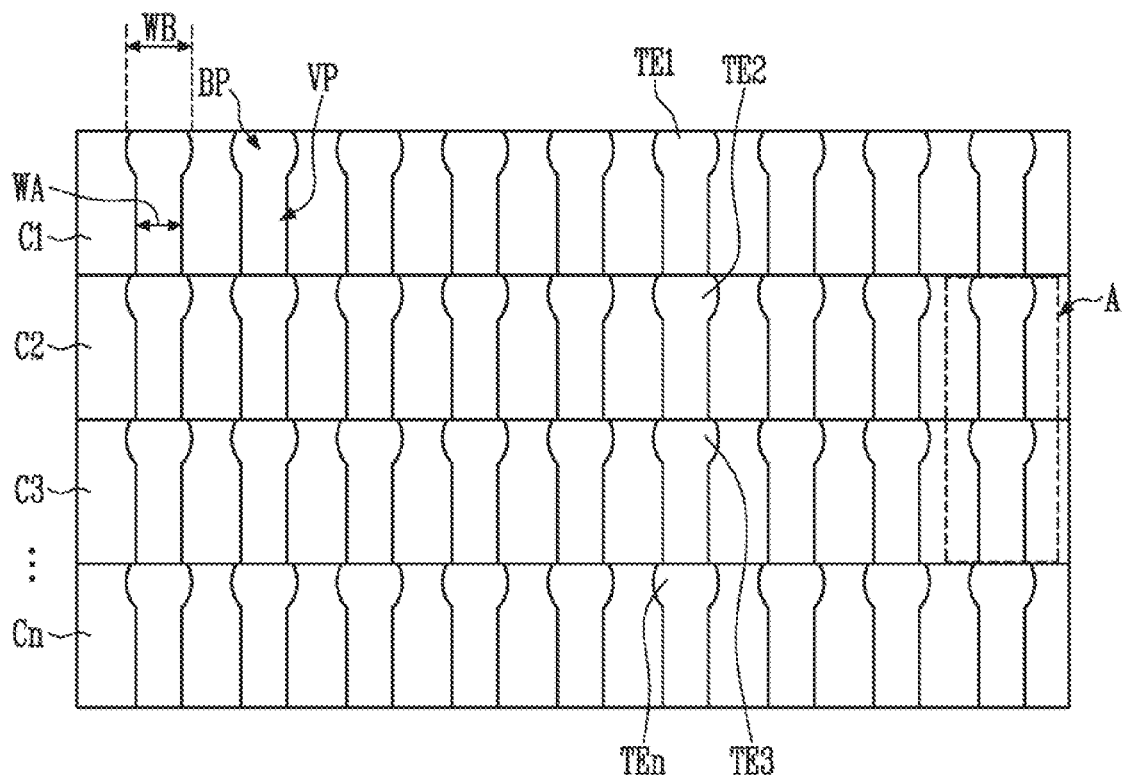
FIG. 1 is a sectional view schematically illustrating a stacked type semiconductor device in accordance with an embodiment of the present disclosure.

FIG. 1 is a sectional view schematically illustrating a stacked type semiconductor device 10 in accordance with an embodiment of the present disclosure. FIG. 1 is a sectional view taken along a through via region in which through electrodes TE1 to TEn of the stacked type semiconductor device 10 are disposed.

Referring to FIG. 1, the stacked type semiconductor device 10 may include a plurality of semiconductor chips C1 to Cn (n is a natural number of 2 or more). The semiconductor chips C1 to Cn may be stacked to overlap with each other. The semiconductor chips C1 to Cn may be penetrated by the through electrodes TE1 to TEn.

The number and arrangement of through electrodes penetrating each of the semiconductor chips C1 to Cn may be various. The through electrodes TE1 to TEn respectively penetrating different semiconductor chips C1 to Cn may be aligned in a line. A bonding medium such as a bump may be disposed between through electrodes to achieve electrical connection between the through electrodes. In embodiments of the present disclosure, the through electrodes TE1 to TEn aligned in a line may be directly bonded to each other without any medium such as a bump, to be electrically connected to each other. The through electrodes TE1 to TEn connected to each other may be used as data transmission path.

The semiconductor chips C1 to Cn may be the same kind of chips or different kinds of chips. In an embodiment, each of the semiconductor chips C1 to Cn may be a memory chip. In another embodiment, at least one of the semiconductor chips C1 to Cn may correspond to a logic chip, and the others may correspond to a memory chip. In still another embodiment, at least one of the semiconductor chips C1 to Cn may correspond to a logic chip, and the others may correspond to a pixel chip.

Each of the through electrodes TE1 to TEn may include a buffer part BP and a vertical part VP extending from the buffer part BP. The vertical part VP of an upper through electrode and the buffer part of a lower through electrode are bonded to each other, so that the through electrodes TE1 to TEn are electrically connected to each other.

Hereinafter, a semiconductor chip (e.g., C2) disposed at a relatively upper portion among the semiconductor chips C1 to Cn is designated as a first semiconductor chip, and a semiconductor chip (e.g., C3) disposed at a relatively lower portion among the semiconductor chips C1 to Cn is designated as a second semiconductor chip. In addition, a through electrode (e.g., TE2) disposed at a relatively upper portion among the through electrodes TE1 to TEn is designated by a first through electrode, and a through electrode (e.g., TE3) disposed at a relatively lower portion among the through electrodes TE1 to TEn is designated by a second through electrode.

Figure 2:
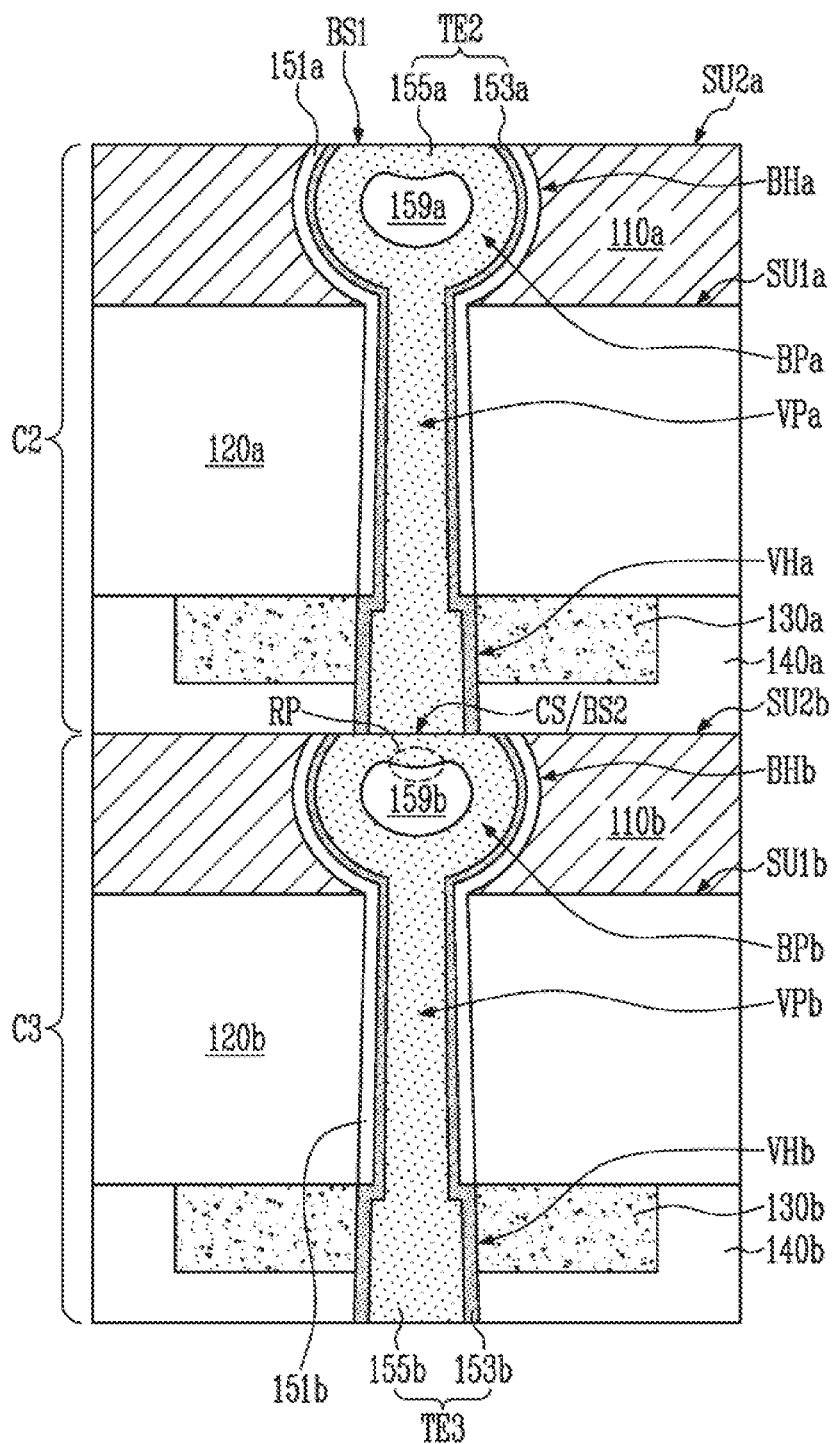
FIG. 2 is an enlarged sectional view illustrating region A shown in FIG. 1.

FIG. 2 is an enlarged sectional view illustrating region A shown in FIG. 1. buffer parts BP of the through electrodes TE1 to TEn described with reference to FIG. 1 may include a first buffer part BPa of a first through electrode TE2 and a second buffer part BPb of a second through electrode TE3, and vertical parts VP of the through electrodes TE1 to TEn described with reference to FIG. 1 may include a first vertical part VPa of the first through electrode TE2 and a second vertical part VPb of the second through electrode TE3.

Referring to FIG. 2, each of a first semiconductor chip C2 and a second semiconductor chip C3 may include a substrate 110a or 110b, a first insulating structure 120a or 120b, a conductive pad 130a or 130b, and a second insulating structure 140a or 140b.

Each of the substrates 110a and 110b of the first semiconductor chip C2 and the second semiconductor chip C3 may have a first surface SU1a or SU1b and a second surface SU2a or SU2b opposite to the first surface SU1a or SU1b. The first insulating structures 120a and 120b of the first semiconductor chip C2 and the second semiconductor chip C3 may be formed on the first surfaces SU1a and SU1b of the substrates 110a and 110b, respectively. The conductive pad 130a of the first semiconductor chip C2 may face the first surface SU1a of the substrate 110a with the first insulating structure 120a interposed therebetween and the conductive pad 130b of the second semiconductor chip C3 may face the first surface SU1b of the substrate 110b with the first insulating structure 120b interposed therebetween. The second insulating structures 140a and 140b of the first semiconductor chip C2 and the second semiconductor chip C3 may be formed to respectively cover a surface of the first insulating structure 120a, on which the conductive pad 130a is disposed, and a surface of the first insulating structure 120b, on which the conductive pad 130b is disposed.

The substrate 110b of the second semiconductor chip C3 may be bonded to the second insulating structure 140a of the first semiconductor chip C2. Each of the first through electrode TE2 and the second through electrode TE3 may fill a buffer hole and a via hole, which correspond thereto. In other words, the first through electrode TE2 may fill a first buffer hole BHa and a first via hole VHa, and the second through electrode TE3 may fill a second buffer hole BHb and a second via hole VHb.

The first buffer hole BHa may extend toward the second surface SU2a from the first surface SU1a to penetrate the substrate 110a of the first semiconductor chip C2. The first via hole VHa may extend from the first buffer hole BHa, and may penetrate the first insulating structure 120a, the conductive pad 130a, and the second insulating structure 140a of the first semiconductor chip C2. The first buffer part BPa of the first through electrode TE2 may be disposed in the first buffer hole BHa. The first vertical part VPa of the first through electrode TE2 may extend from the first buffer part BPa and fill the first via hole VHa.

The second buffer hole BHb may extend toward the second surface SU2b from the first surface SU1b to penetrate the substrate 110b of the second semiconductor chip C3. The second via hole VHb may extend from the second buffer hole BHb, and may penetrate the first insulating structure 120b, the conductive pad 130b, and the second insulating structure 140b of the second semiconductor chip C3. The second buffer part BPb of the second through electrode TE3 may be disposed in the second buffer hole BHb. The second vertical part VPb of the second through electrode TE3 may extend from the second buffer part BPb and fill the second via hole VHb.

The substrates 110a and 110b of the first and second semiconductor chips C2 and C3 may be insulated from the first and second through electrodes TE2 and TE3 by sidewall insulating patterns 151a and 151b. The sidewall insulating pattern 151a may extend between the buffer part BPa and the substrate 110a and between the vertical part VPa and the first insulating structure 120a. The sidewall insulating pattern 151b may extend between the buffer part BPb and the substrate 110b and between the vertical part VPb and the first insulating structure 120b. The first vertical part VPa of the first through electrode TE2 and the second vertical part VPb of the second through electrode TE3 may be in contact with the conductive pads 130a and 130b, respectively. In an embodiment, the first vertical part VPa of the first through electrode TE2 may farther protrude than the sidewall insulating pattern 151a to be in contact with the conductive pad 130a and the second insulating structure 140a, and the first vertical part VPb of the second through electrode TE3 may farther protrude than the sidewall insulating pattern 151b to be in contact with the conductive pad 130b and the second insulating structure 140b.

Empty gaps may be respectively buried in the first and second through electrodes TE2 and TE3. The empty gaps may comprise air-gaps. The empty gaps may include a first empty gap 159a buried in the first through electrode TE2 and a second empty gap 159b buried in the second through electrode TE3. The first vertical part VPa may be disposed between the first empty gap 159a and the second empty gap 159b.

The first empty gap 159a may be disposed in the first buffer hole BHa, and be surrounded by the first buffer part BPa of the first through electrode TE2. That is, the first empty gap 159a may be sealed in the first buffer hole BHa by the first buffer part BPa.

The second empty gap 159b may be disposed in the second buffer hole BHb, and be surrounded by the second buffer part BPb of the second through electrode TE3. That is, the second empty gap 159b may be sealed in the second buffer hole BHb by the second buffer part BPb.

Each of the first and second buffer holes BHa and BHb may have a width wider than that of each of the first and second via holes VHa and VHb. Accordingly, a width WB of the buffer part BP shown in FIG. 1 can be defined to be greater than a width WA of the vertical part VP. Further, the first and second empty gaps 159a and 159b can be formed in the first and second buffer holes BHa and BHb. In an embodiment, each of the first and second buffer holes BHa and BHb may have a curved sidewall extending in a stacked direction in which the first through electrode TE2 and the second through electrode TE3 are stacked, and each of the first and second via holes VHa and VHb may have a flat sidewall extending in the stacked direction.

The second buffer part BPb may include a recessed part RP recessed to the inside of the second air-gap 159b by a pressure generated in bonding between the second buffer part BPb and the first vertical part VPa.

Each of the substrates 110a and 110b may be a semiconductor substrate made of silicon, germanium, gallium arsenide, etc.

Each of the first insulating structures 120a and 120b may extend to cover an integrated circuit formed in main regions which are not shown in the drawing, and include multi-layered insulating layers.

Each of the conductive pads 130a and 130b may be connected to an integrated circuit disposed in main regions of a semiconductor chip corresponding thereto. The conductive pads 130a and 130b may be formed of various conductive materials. In an embodiment, the conductive pads 130a and 130b may include aluminum.

The second insulating structures 140a and 140b may include various insulating materials. In an embodiment, the second insulating structures 140a and 140b may include a silicon oxide layer.

Each of the first and second through electrodes TE2 and TE3 may include a barrier layer 153a or 153b and a metal layer 155a or 155b. Each of the barrier layers 153a and 153b may be formed in a single layer made of titanium, titanium nitride, tantalum, tantalum nitride, tungsten, tungsten nitride, nickel, nickel nitride, etc., or be formed in a double layer including titanium and titanium nitride. Each of the metal layers 155a and 155b may include various metals which can be bonded through low temperature plasma annealing. In an embodiment, each of the metal layers 155a and 155b may include a metal which can be bonded at 300° C. or less. In an embodiment, each of the metal layers 155a and 155b may include copper.

The metal layers 155a and 155b of the first and second through electrodes TE2 and TE3 may be bonded to each other. The metal layers 155a and 155b may respectively surround the empty gaps 159a and 159b. In other words, the first empty gap 150a may be buried in the metal layer 155a, and the second empty gap 159b may be buried in the metal layer 155b.

The barrier layers 153a and 153b may be respectively formed on sidewalls of the metal layer 155a and 155b. That is, the barrier layers 153a and 153b may be disposed between the metal layer 155a and the sidewall insulating pattern 151a, and between the metal layer 155b and the sidewall insulating pattern 151b, respectively. The barrier layer 153a may extend between the metal layer 155a and the conductive pad 130a, and between the metal layer 155a and the second insulating structure 140a. The barrier layer 153b may extend between the metal layer 155b and the conductive pad 130b, and between the metal layer 155b and the second insulating structure 140b.

In accordance with an above-described embodiment of the present disclosure, each of the through electrodes may include a contact surface in contact with a conductive pad, a first bonding surface adjacent to a second surface of a substrate, and a second bonding surface adjacent to a surface of a second insulating structure. For example, the first through electrode TE2 may include a contact surface CS in contact with the conductive pad 130a, a first bonding surface BS1 adjacent to the second surface SU2a of the substrate 110a, and a second bonding surface BS2 adjacent to a surface of the second insulating structure 140a. The second bonding surface BS2 may be provided as the contact surface CS. The surface of the second insulating structure 140a may be in contact with the second surface SU2b of the substrate 110b adjacent thereto.

Figure 3:
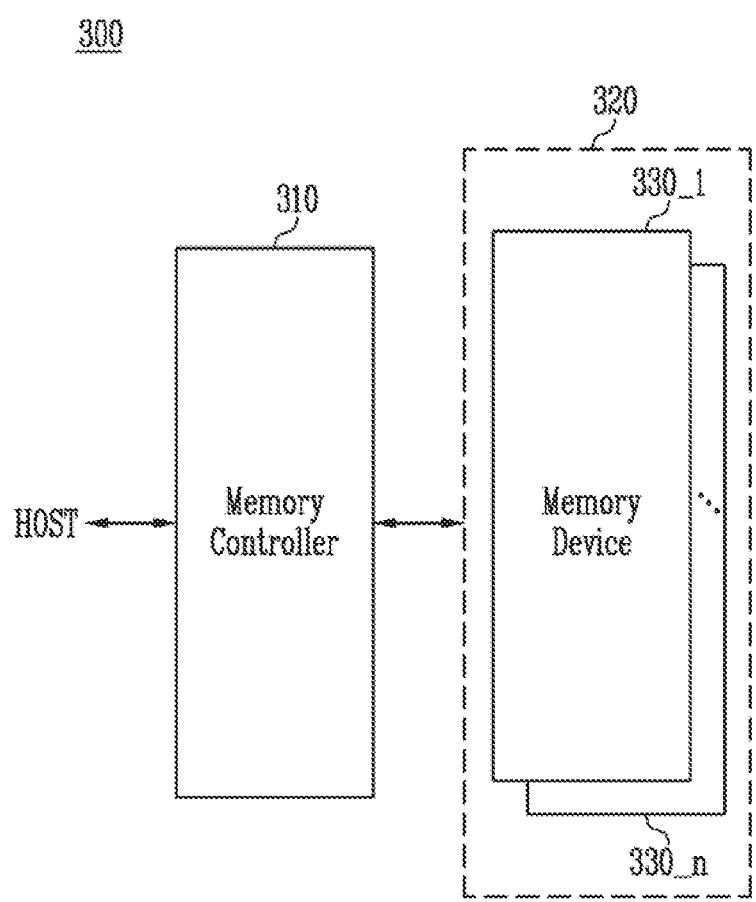
FIG. 3 is a block diagram illustrating a memory system in accordance with an embodiment of the present disclosure.

FIG. 3 is a block diagram illustrating a memory system 300 in accordance with an embodiment of the present disclosure.

Referring to FIG. 3, the memory system 300 may be applied to an electronic device, such as a computer, a digital camera, or a smart phone, to process data.

The memory system 300 may include a memory controller 310 and a stacked type memory device 320.

The memory controller 310 may transmit data to the stacked type memory device 320 or provide a control signal to the stacked type memory device 320, according to an access request from a host HOST. The memory controller 310 may detect an error from data read from the stacked type memory device 320, and correct the detected error.

The stacked type memory device 320 may include two or more memory chips 330_1 to 330_n stacked on each other. Each of the memory chips 330_1 to 330_n may include a volatile memory device or a nonvolatile memory device. For example, each of the memory chips 330_1 to 330_n may include a Dynamic Random Access Memory (DRAM), a Read Only Memory (ROM), a Mask ROM (MROM), a Programmable ROM (PROM), an Erasable Programmable ROM (EPROM), an Electrically Erasable Programmable ROM (EEPROM), a NAND flash memory, a NOR flash memory, a Phase change Random Access Memory (PRAM), a Magnetic RAM (MRAM), a Resistive RAM (RRAM), a Ferroelectric RAM (FRAM), etc.

The memory chips 330_1 to 330_n may be bonded to each other through the through electrodes described with reference to FIGS. 1 and 2.

Figure 4:
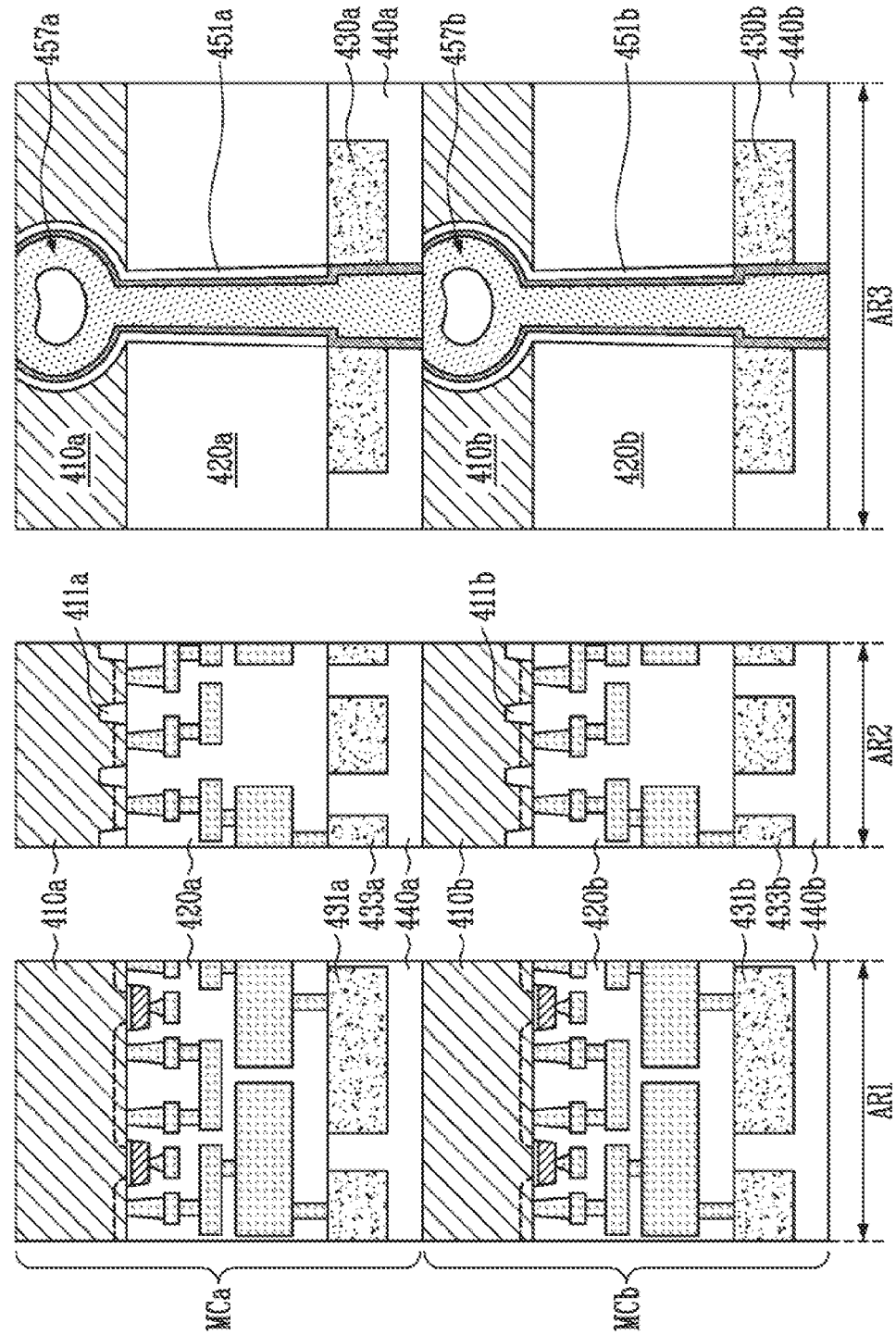
FIG. 4 is a sectional view illustrating a stacked type memory device in accordance with an embodiment of the present disclosure.

FIG. 4 is a sectional view illustrating a stacked type memory device 400 in accordance with an embodiment of the present disclosure.

The stacked type memory device 400 may include a memory cell array region AR1, a peripheral circuit region AR2, and a through via region AR3. The memory cell array region AR1 and the peripheral circuit region AR2 may be included a main region of the stacked type memory device 400. The through via region AR3 may be a region which provides a data transmission path and have through electrodes 457a and 457b bonded to each other, which are disposed therein.

The stacked type memory device 400 may include a first memory chip MCa and a second memory chip MCb, which overlap with each other. Each of the first memory chip MCa and the second memory chip MCb may include a semiconductor substrate 410a or 410b, a first insulating structure 420a or 420b formed on a surface of the semiconductor substrate 410a or 410b, and a second insulating structure 440a or 440b formed on a surface of the first insulating structure 420a or 420b.

Various impurities for a well structure and a channel may be doped in the semiconductor substrates 410a and 410b. Isolation layers 411a and 411b may be buried in the semiconductor substrates 410a and 410b.

A memory cell and lines connected to the memory cell may be buried in each of the first insulating structures 420a and 420b in the memory cell array region AR1. Although a case where the memory cell includes a DRAM cell structure is exemplified in FIG. 4, the present disclosure is not limited thereto. Conductive pads 431a and 431b may be buried in the second insulating structures 440a and 440b, respectively, in the memory cell array region AR1. The conductive pads 431a and 431b formed in the memory cell array region AR1 may be connected to the memory cells via the lines buried in the first insulating structure 420a and 420b.

A peripheral circuit for controlling an operation of memory cells and lines connected to the peripheral circuit may be buried in each of the first insulating structures 420a and 420b in the peripheral circuit region AR2. The peripheral circuit may input data to a memory cell or read data from a memory cell, according to a control signal input from the outside (e.g., a memory controller). Conductive pads 433a and 433b may be buried in the second insulating structures 440a and 440b, respectively, in the peripheral circuit region AR2. Each of the conductive pads 433a and 433b formed in the peripheral circuit region AR2 may be connected to the peripheral circuit corresponding thereto via the lines buried in the first insulating structure 420a or 420b corresponding thereto.

The first insulating structures 420a and 420b and the second insulating structures 440a and 440b, which are described above, may extend to the through via region AR3. Through electrodes 457a and 457b used as a path through which the stacked type memory device 400 exchanged data or signals with the outside (e.g., the memory controller) of the stacked type memory device 400 may be formed in the through via region AR3. The through electrodes 457a and 457b may be insulated from the substrates 410a and 410b through sidewall insulating patterns 451a and 451b, respectively, and be electrically connected to conductive pads 430a and 430b disposed in the peripheral circuit region AR2, respectively.

The through electrodes 457a and 457b may be formed in the same structure as each of the first through electrode TE2 and the second through electrode TE3, which are described with reference to FIG. 2.

Figure 5:
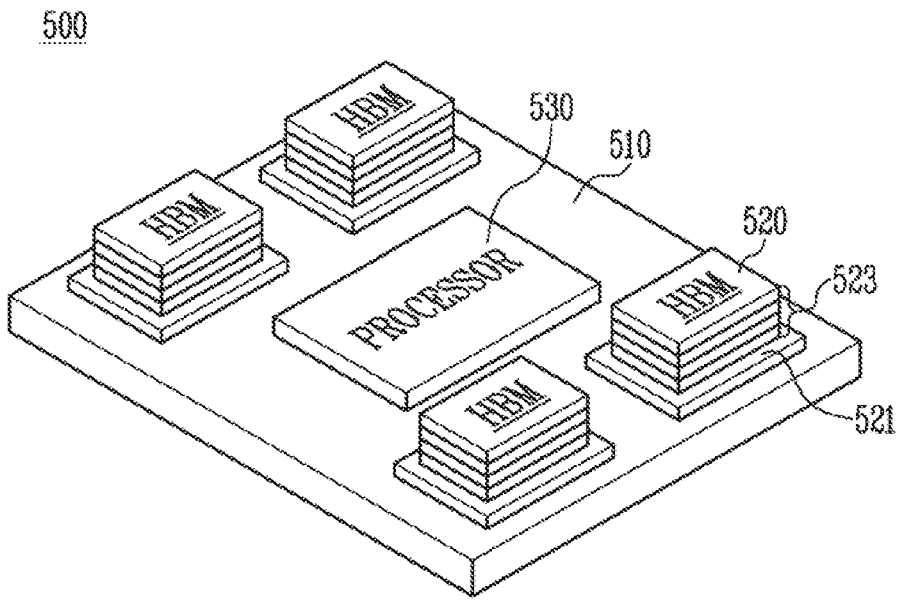
FIG. 5 is a view illustrating a memory system in accordance with an embodiment of the present disclosure.

FIG. 5 is a view illustrating a memory system 500 in accordance with an embodiment of the present disclosure.

Referring to FIG. 5, the memory system 500 may include high bandwidth memory device (HBM) 520 and a PROCESSOR 530, which are mounted on an interposer 510.

The HBM 520 may be connected to the processor 530 through the interposer 510. The HBM 520 may include an interface chip 521 disposed on the interposer 510 and memory chips 523 stacked on the interface chip 521. The memory chips 523 and the interface chip 521 may be electrically connected to each other through a bonding structure of through electrodes as described with reference to FIG. 1. Each of the through electrodes penetrating the memory chips 523 and the interface chip 521 may include an empty gap as described with reference to FIG. 2.

The interface chip 521 may provide an interface for communication between the processor 530 and the memory chips 523.

The processor 530 may include a memory controller for controlling each HBM 520. For example, the processor 530 may include a Graphic Processing Unit (GPU) or a Central Processing Unit (CPU), in which the memory control is built.

Figure 6:
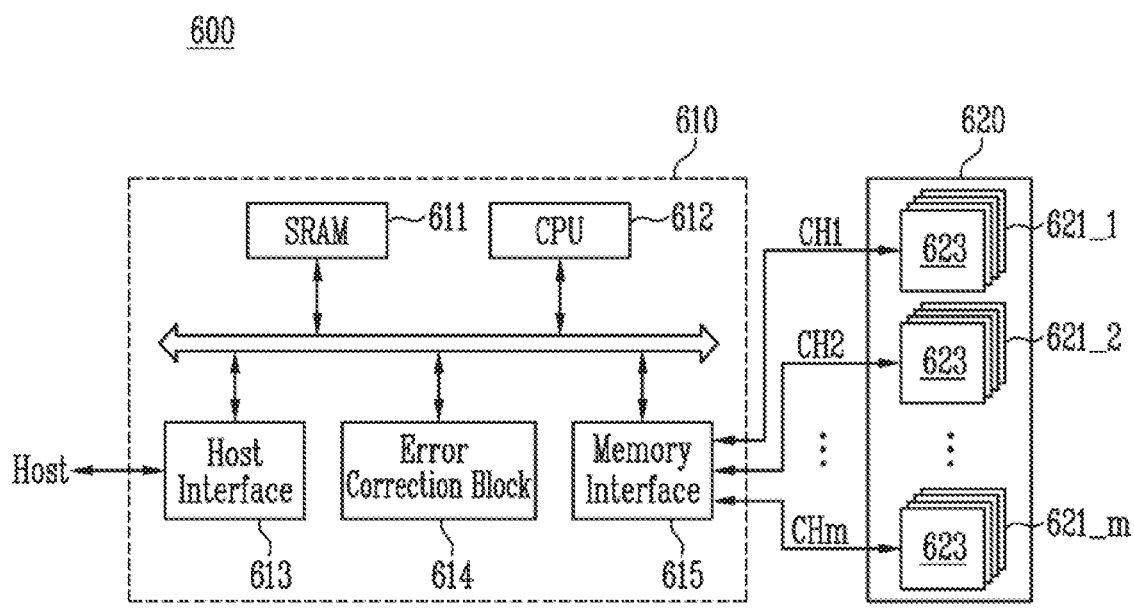
FIG. 6 is a block diagram illustrating a memory system in accordance with an embodiment of the present disclosure.

FIG. 6 is a block diagram illustrating a memory system 600 in accordance with an embodiment of the present disclosure.

Referring to FIG. 6, the memory system 600 may include a memory controller 610 and a stacked type memory device 620.

The memory controller 610 may control the stacked type memory device 620, and include a Static Random Access Memory (SRAM) 611, a Central Processing Unit (CPU) 612, a host interface 613, an error correction block 614, and a memory interface 615. The SRAM 611 may be used as a working memory of the CPU 612. The CPU 612 may perform overall control operations for data exchange of the memory controller 610. The host interface 613 is provided with a data exchange protocol of a host Host connected to the memory system 600. The error correction block 614 detects an error included in data read from the stacked type memory device 620, and corrects the detected error. The memory interface 615 performs interfacing with the stacked type memory device 620. The memory controller 610 may further include a Read Only Memory (ROM) which stores code data for interfacing with the host Host, and the like.

The stacked type memory device 620 may include a plurality of memory packages 621_1 to 621_m. Each of the memory packages 621_1 to 621_m may be formed in a structure in which a plurality of memory chips 623 are stacked. The memory chips 623 may be electrically connected to each other through a bonding structure of through electrodes as described with reference to FIG. 1. Each of the through electrodes penetrating the memory chips 623 may include an empty gap as described with reference to FIG. 2.

A plurality of channels CH1 to CHm may be provided to the memory controller 610 and the stacked type memory device 620. A memory package corresponding to each of the channels CH1 to CHm may be electrically connected to the channel. Each of the channels CH1 to CHm may be electrically connected to a memory package corresponding thereto through the through electrodes penetrating the memory chips 623.

The above-described memory system 600 may be a memory card or a Solid State Drive (SSD), in which the stacked type memory device 620 and the memory controller 610 are coupled to each other. For example, when the memory system 600 is the SSD, the memory controller 610 may communicate with the outside (e.g., the host) through one of various interface protocols, such as a Universal Serial Bus (USB) protocol, a Multi-Media Card (MMC) protocol, a Peripheral Component Interconnection (PCI) protocol, a PCI-Express (PCI-E) protocol, an Advanced Technology Attachment (ATA) protocol, a Serial-ATA (SATA) protocol, a Parallel-ATA (PATA) protocol, a Small Computer Small Interface (SCSI) protocol, an Enhanced Small Disk Interface (ESDI) protocol, and an Integrated Drive Electronics (IDE) protocol.

Figure 7:
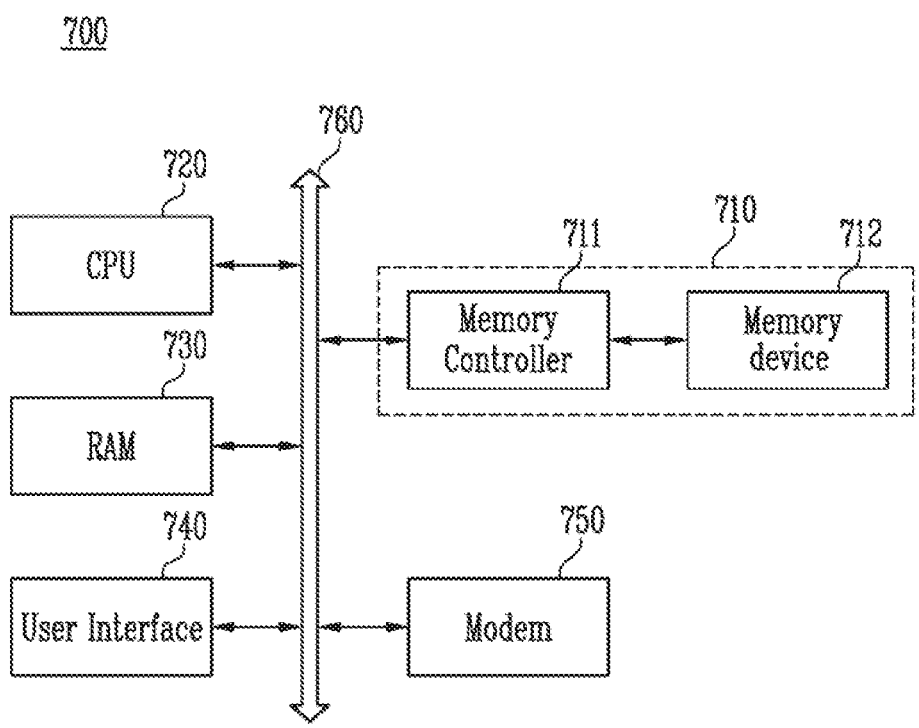
FIG. 7 is a block diagram illustrating a computing system in accordance with an embodiment of the present disclosure.

FIG. 7 is a block diagram illustrating a computing system in accordance with an embodiment of the present disclosure.

Referring to FIG. 7, the computing system 700 may include a CPU 720, a Random Access Memory (RAM) 730, a user interface 740, a modem 750, and a memory system 710, which are electrically connected to a system bus 760. When the computing system 700 is a mobile device, a battery for supplying an operation voltage to the computing system 700 may be further included, and an application chip set, an image processor, a mobile DRAM, and the like may be further included.

The memory system 710 may include a memory controller 711 and a memory device 712. The memory device 712 may be configured identically to the stacked type memory device 620 described with reference to FIG. 6. The memory controller 711 may be configured identically to the memory controller 610 described with reference to FIG. 6.

Figure 8:
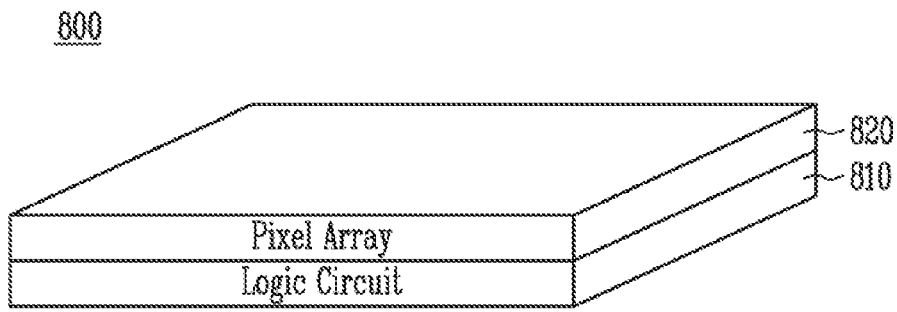
FIG. 8 is a view illustrating a CMOS image sensor in accordance with an embodiment of the present disclosure.

FIG. 8 is a view illustrating a CMOS Image Sensor (CIS) 800 in accordance with an embodiment of the present disclosure.

Referring to FIG. 8, the CIS 800 may include a logic chip 810 and a pixel chip 820 stacked on the logic chip 810.

The logic chip 810 may include a logic circuit for processing pixel signals from the pixel chip 820. The logic circuit may include a row driver, a Correlated Double Sampler (CDS), an Analog-to-Digital Converter (ADC), a timing controller, and the like.

The pixel chip 820 may include a pixel array. The pixel array may generate an electrical pixel signal by converting incident light. The pixel array may include a plurality of unit pixels arranged in a matrix form. The pixel array may be driven by driving signals provided from the logic chip 810.

The logic chip 810 and the pixel chip 820 may be penetrated through through electrodes bonded to each other, and be electrically connected to each other through the through electrodes. The through electrodes through which the logic chip 810 and the pixel chip 820 are penetrated may be configured identically to the first through electrode TE2 and the second through electrode TE3, which are described with reference to FIG. 2.

FIGS. 9A, 9B, 9C, 9D, 9E, 9F, 9G, 9H, 9I, 9J, 10A, and 10B are sectional views illustrating a manufacturing method of a stacked type semiconductor device in accordance with an embodiment of the present disclosure. FIGS. 9A, 9B, 9C, 9D, 9E, 9F, 9G, 9H, 9I, 9J, 10A, and 10B are sectional views taken along a through via region of the stacked type semiconductor device.

FIGS. 9A to 9J are sectional views illustrating an embodiment of a manufacturing method of a semiconductor chip.

Figure 9A:
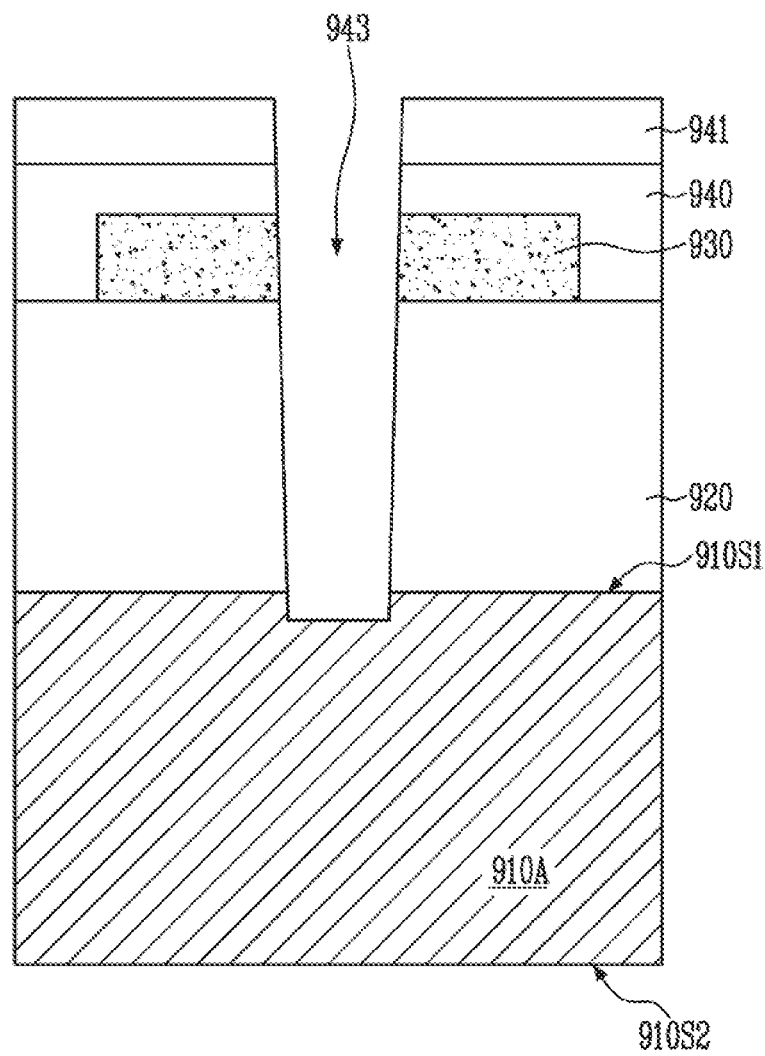

Referring to FIG. 9A, a first insulating structure 920 may be formed on a first surface 910S1 of a preliminary substrate 910A having the first surface 910S1 and a second surface 910S2 opposite to the first surface 910S1. Although not shown in the drawing, elements and lines for at least one of a memory cell array, a pixel array, a peripheral circuit, and a logic circuit for the semiconductor chip may be formed in a main region (not shown) of the preliminary substrate 910A.

The preliminary substrate 910A may be a semiconductor substrate made of silicon, germanium, gallium arsenide, etc. Various impurities for a well structure, a channel region, etc. may be doped in the preliminary substrate 910A.

The first insulating structure 920 may extend to cover the main region (not shown) of the preliminary substrate 910A. The first insulating structure 920 may include two or more insulating layers stacked on the preliminary substrate 910A.

Subsequently, a conductive pad 930 may be formed on the first insulating structure 920. Subsequently, a second insulating structure 940 may be formed on the first insulating structure 920. The second insulating structure 940 may be formed to cover the conductive pad 930.

Subsequently, the mask pattern 941 may be formed on the second insulating structure 940. The mask pattern 941 may be patterned by using a photolithography process to have an opening overlapping with the conductive pad 930.

A via hole 943 may be formed by sequentially etching the second insulating structure 940, the conductive pad 930, and the first insulating structure 920 through an etching process using the above-described mask pattern 941 as an etch barrier. The via hole 943 may be formed to expose the preliminary substrate 910A. The via hole 943 may be formed to a depth to which the via hole 943 does not penetrate the preliminary substrate 910A. In an embodiment, the via hole 943 may be formed to a depth corresponding to the thickness of a stack structure including the second insulating structure 940, the conductive pad 930, and the first insulating structure 920. A width of the via hole 943 may be formed narrower than that of the conductive pad 930.

Figure 9B:
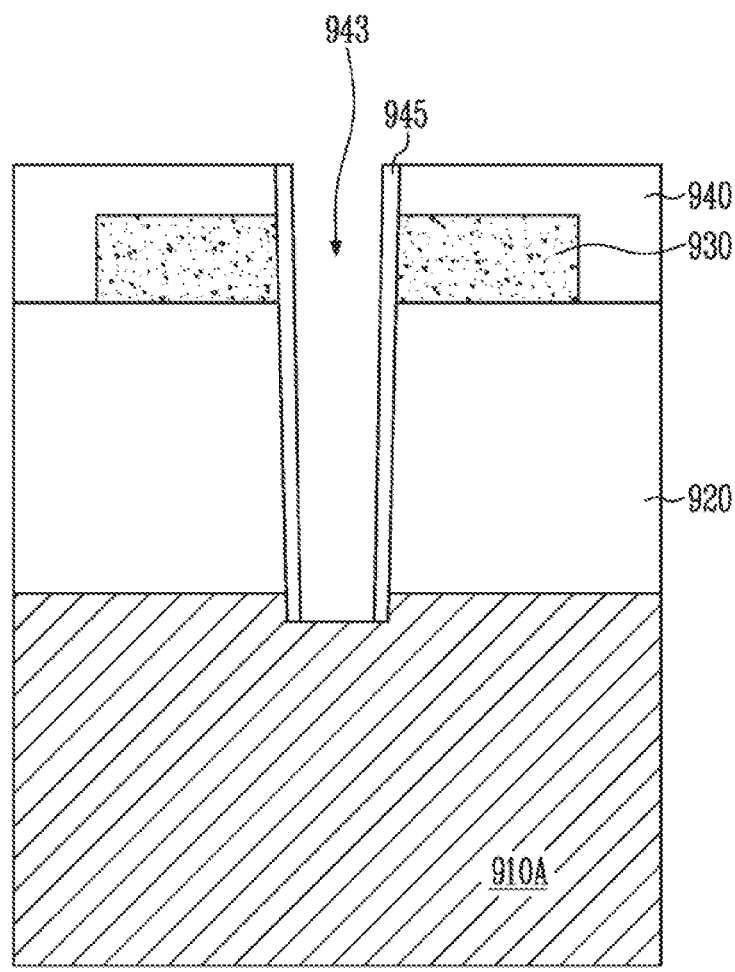

Referring to FIG. 9B, after the via hole 943 is formed, the mask pattern 941 shown in FIG. 9A may be removed. Subsequently, a protective layer 945 may be formed on a sidewall of the via hole 943. The protective layer 945 may be formed of a material having an etching selectivity with respect to the preliminary substrate 910A. In an embodiment, the protective layer 945 may include oxide. The protective layer 945 may be etched such that the preliminary substrate 910A can be exposed through a bottom surface of the via hole 943.

Figure 9C:
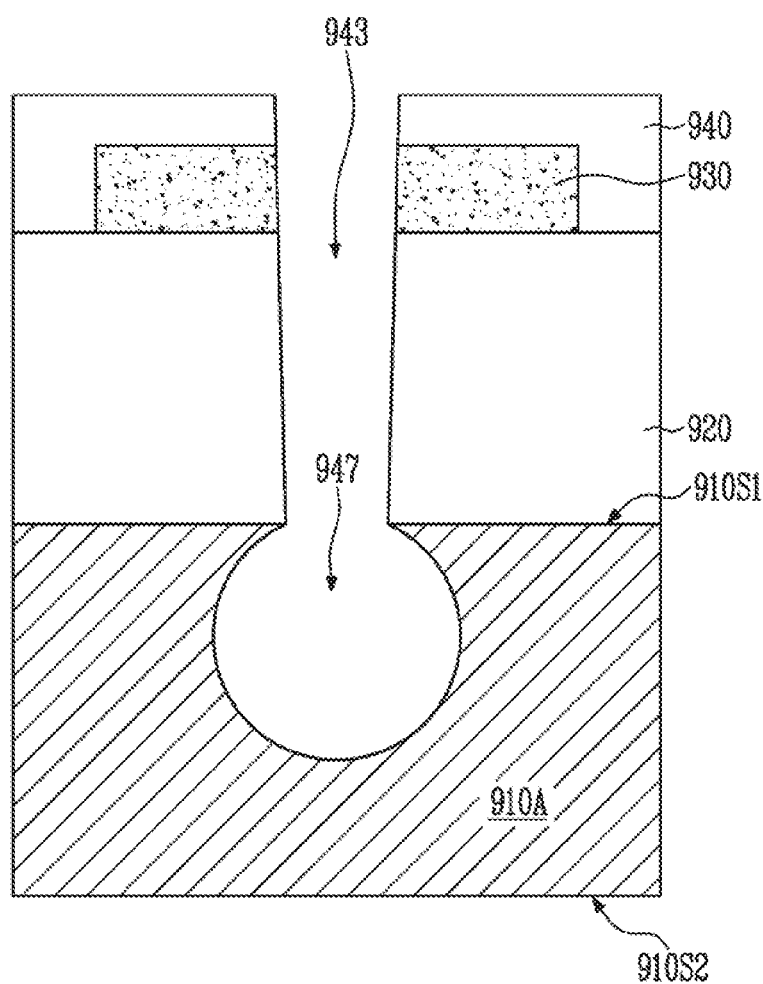

Referring to FIG. 9C, a buffer hole 947 may be formed by etching the preliminary substrate 910A through the via hole 943. While the preliminary substrate 910A is being etched, the first insulating structure 920, the conductive pad 930, and the second insulating structure 940 may be protected by the protective layer 945 shown in FIG. 9B. The protective layer 945 may be removed after the buffer hole 947 is formed.

The etching process for forming the buffer hole 947 may be performed through an isotropic etching process. Accordingly, a sidewall of the buffer hole 947 may have a curvature greater than that of a sidewall of the via hole 943 in a direction in which the preliminary substrate 910A and the first insulating structure 920 are stacked. In an embodiment, the buffer hole 947 may be formed in a circular shape or an elliptical shape.

The buffer hole 947 may extend to the inside of the preliminary substrate 910A from the via hole 943. A bottom surface of the buffer hole 947 may be spaced apart from the second surface 910S2 of the preliminary substrate 910A. In other words, the buffer hole 947 may be formed to a depth to which the buffer hole 947 does not completely penetrate the preliminary substrate 910A.

Figure 9D:
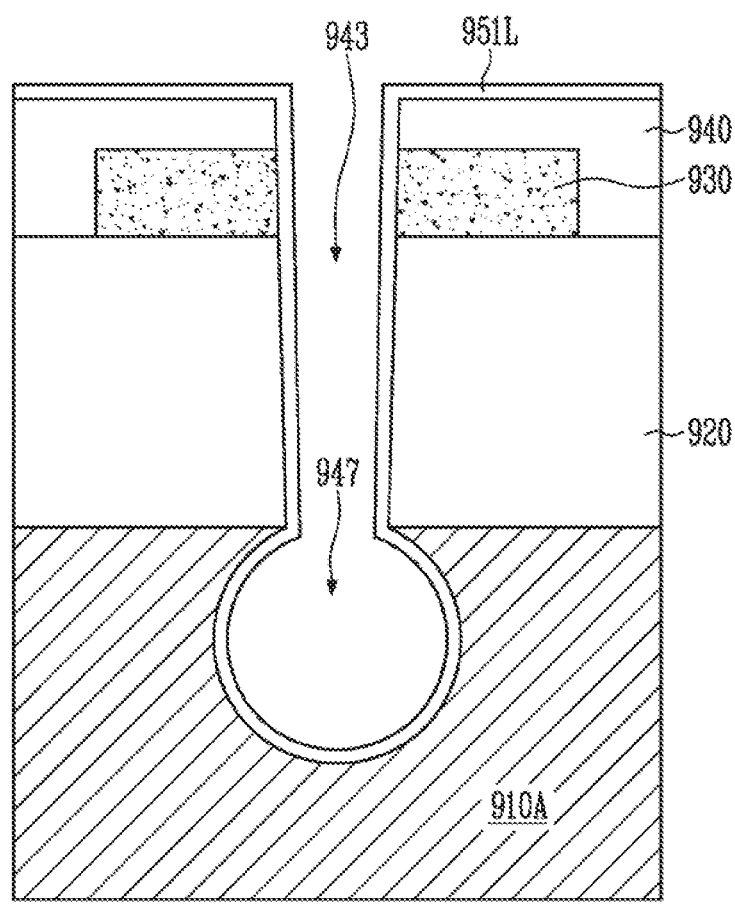

Referring to FIG. 9D, an insulating layer 951L may be formed on a surface of each of the buffer hole 947 and the via hole 943. The insulating layer 951L may extend onto a sidewall of the first insulating structure 920, which defines the sidewall of the via hole 943, a sidewall of the conductive pad 930, and a sidewall of the second insulating structure 940, and extend onto a top surface of the second insulating structure 940. The insulating layer 951L may include an oxide layer.

Referring to FIG. 9E, a sacrificial material 952 may be formed on the insulating layer 951L. The sacrificial material 952 may be formed to fill the buffer hole 947 and the via hole 943, which are shown in FIG. 9D, by using a spin coating process. Subsequently, an upper end of the via hole 943 shown in FIG. 9D may be opened by removing a portion of the sacrificial material 952. Hereinafter, the upper end of the via hole 943, which is opened when the portion of the sacrificial material 952 is removed, is defined as an opening OP.

The etching process of the sacrificial material 952 for forming the opening OP may include an etching process such as an etch-back process. The sacrificial material 952 may be formed of a material having an etching selectivity with respect to the second insulating structure 940 and the conductive pad 930. In an embodiment, the sacrificial material 952 may include carbon, a photoresist, or an organic compound.

The opening OP may extend to a level at which the sidewall of the conductive pad 930 is disposed. In an embodiment, a top surface of the sacrificial material 952, which defines a bottom surface of the opening OP, may correspond to a level at which a top surface of the insulating structure 920 is disposed.

Figure 9F:
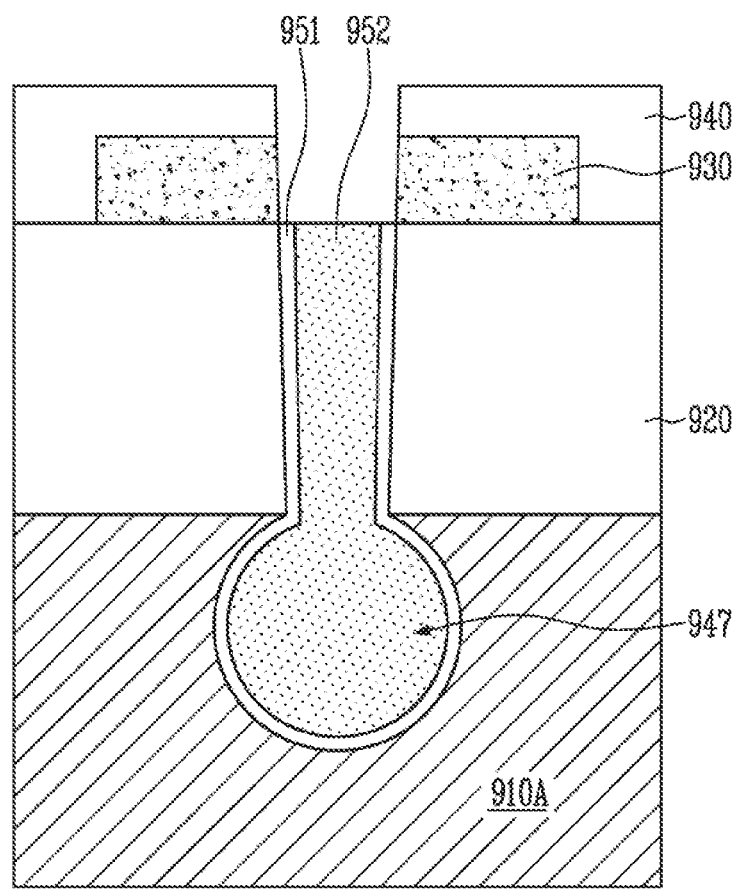

Referring to FIG. 9F, a sidewall insulating layer 951 is formed by etching an exposed portion of the insulating layer 951L shown in FIG. 9E. The sidewall insulating layer 951 may remain in a state in which the sidewall insulating layer 951 extends onto the sidewall of the first insulating structure 920 from a surface of the buffer hole 947.

Figure 9G:
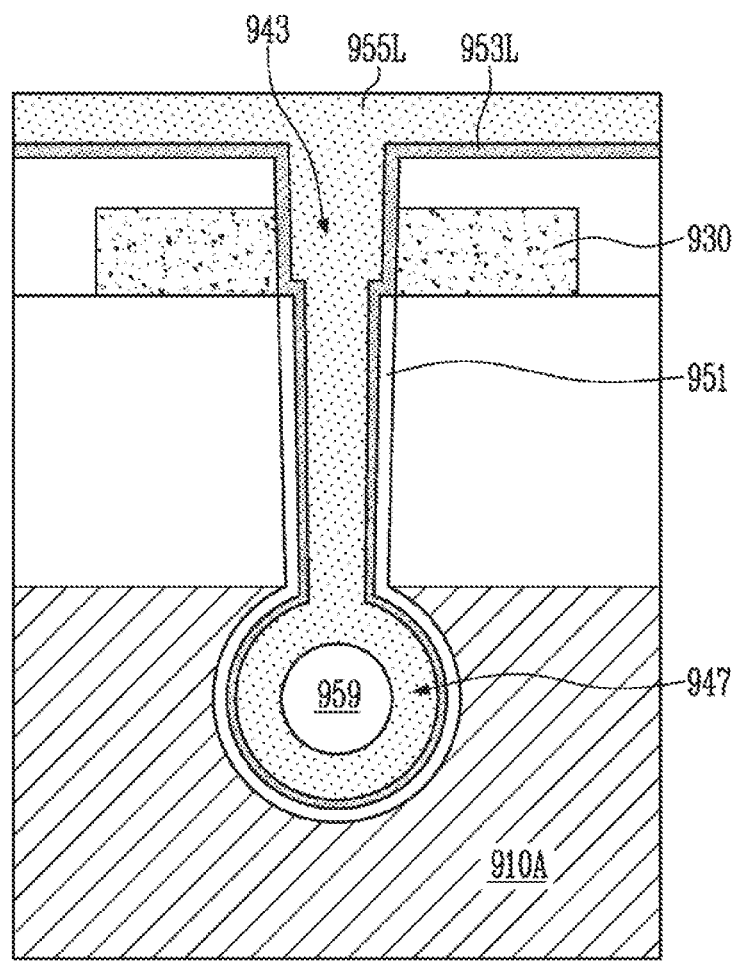

Referring to FIG. 9G, the sidewall insulating layer 951 may be exposed by selectively removing the sacrificial material 952 shown in FIG. 9F. Subsequently, a barrier layer 953L and a metal layer 955L may be sequentially formed on the sidewall insulating layer 951.

The barrier layer 953L may extend onto the sidewall of the conductive pad 930 from the sidewall insulating layer 951. The barrier layer 953L may be connected to the conductive pad 930 exposed on the sidewall insulating layer 951. The barrier layer 953L may be formed in a single layer including titanium, titanium nitride, tantalum, tantalum nitride, tungsten nitride, nickel, nickel boride, etc., or be formed in a double layer including titanium and titanium nitride.

The metal layer 955L may be formed through a deposition process such as electroplating. In an embodiment, the metal layer 955L may include copper. The metal layer 955L may be formed on the barrier layer 953L to fill the buffer hole 947 and the via hole 943. An air gap 959 may be buried in the buffer hole 947 formed to a depth deeper than that of the via hole 943. When a width of the buffer hole 947 is formed wider than that of the via hole 943, the empty gap 959 can be easily buried in the buffer hole 947. The metal layer 955L may completely fill the via hole 943 such that the empty gap 959 can be sealed in the buffer hole 947.

Figure 9H:
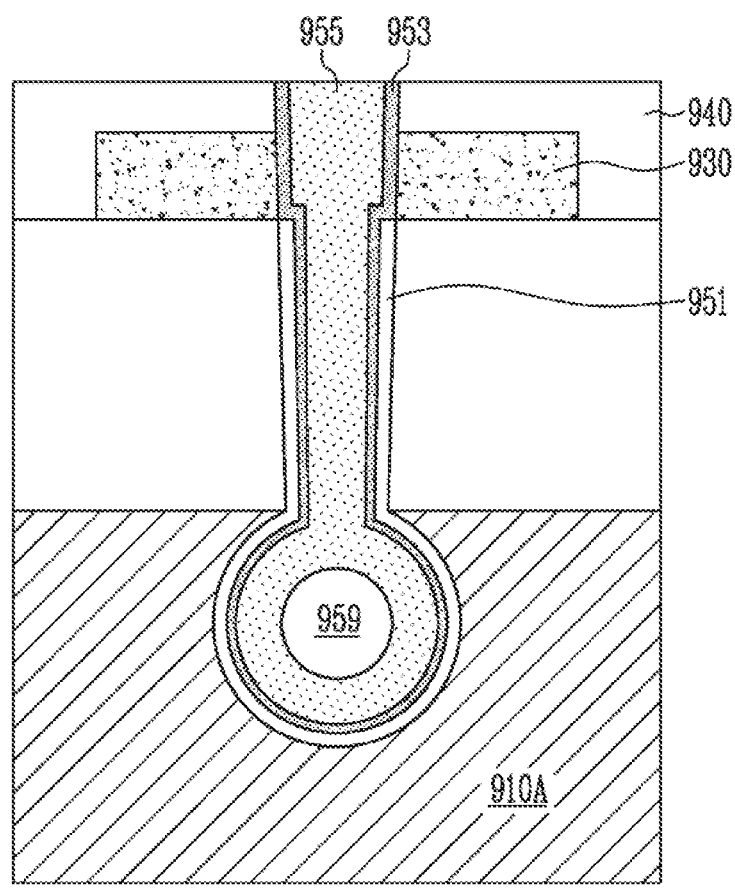

Referring to FIG. 9H, a portion of each of the metal layer 955L and the barrier layer 953L, which are shown in FIG. 9G, may be removed through a planarization process such that the top surface of the second insulating structure 940 is exposed.

Figure 9I:
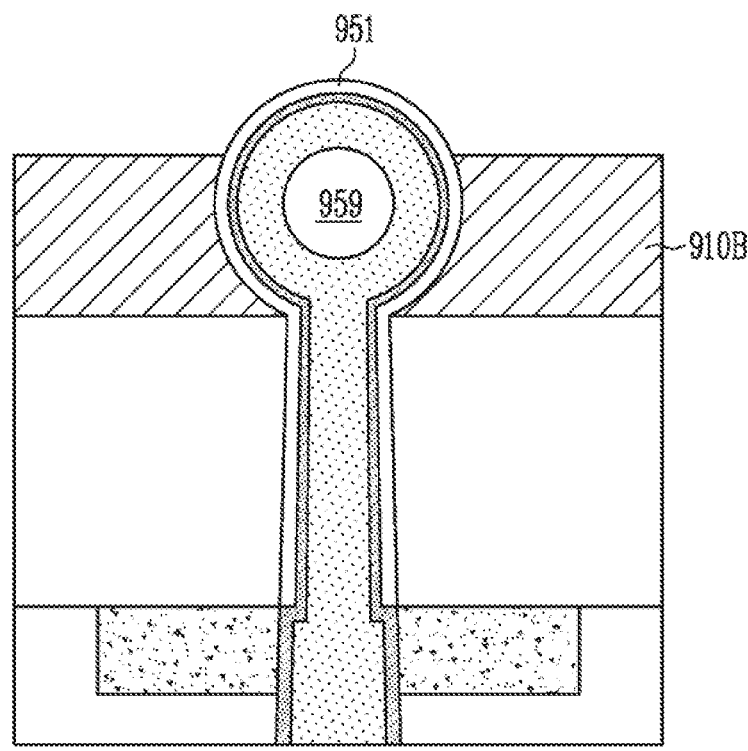

Referring to FIG. 9I, a portion of the preliminary substrate 910A may be removed from the second surface 910S2 of the preliminary substrate 910A shown in FIG. 9H such that an end portion of the sidewall insulating layer 951 is exposed. Accordingly, the thickness of the preliminary substrate 910A can be decreased. Hereinafter, the preliminary substrate having the decreased thickness is defined as a bonding substrate 910B. The end portion of the sidewall insulating layer 951 may be exposed in a state in which the end portion farther protrudes than the bonding substrate 910B.

Figure 9J:
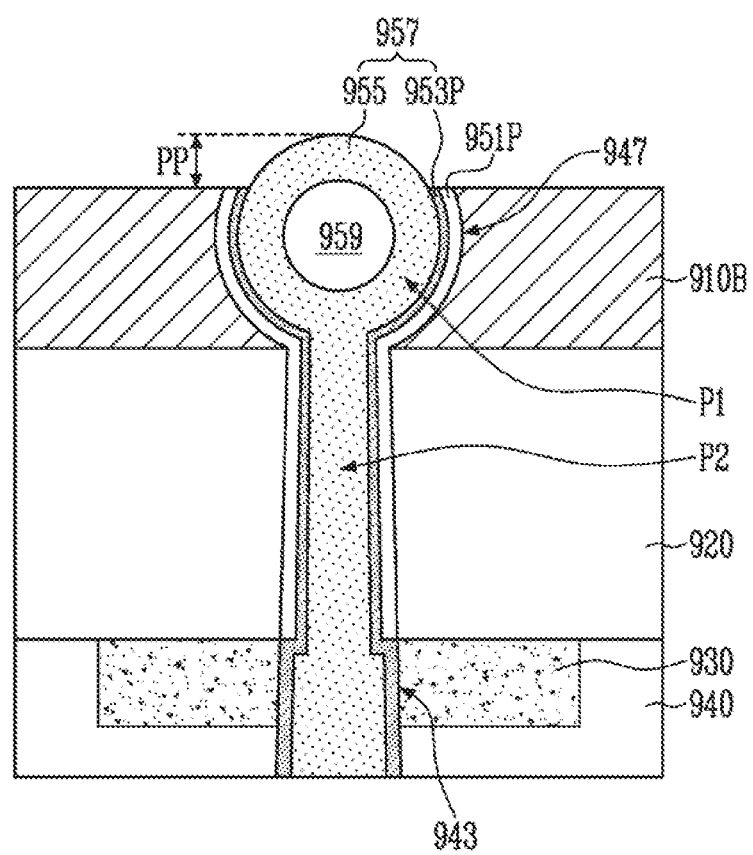

Referring to FIG. 9J, the exposed portion of the sidewall insulating layer 951 shown in FIG. 9I may be removed. Accordingly, a sidewall insulating pattern 951P used as a target may be formed.

Subsequently, a barrier pattern 953P may be formed by removing a portion of the barrier layer such that the metal layer 955 is exposed. The barrier pattern 953P and the metal layer 955 may constitute a through electrode 957. The exposed portion of the metal layer 955 may constitute a protrusion part PP farther protruding than the bonding substrate 910B.

The through electrode 957 formed through the processes described with reference to FIGS. 9A to 9J may include a buffer part P1 filling the buffer hole 947 in the bonding substrate 910B and a vertical part P2 extending from the buffer part P1. The vertical part P2 may be formed on the sidewall insulating pattern 951P to fill the via hole 943 penetrating the first insulating structure 920, the conductive pattern 930, and the second insulating structure 940, and be in contact with the conductive pad 930.

Figure 10B:
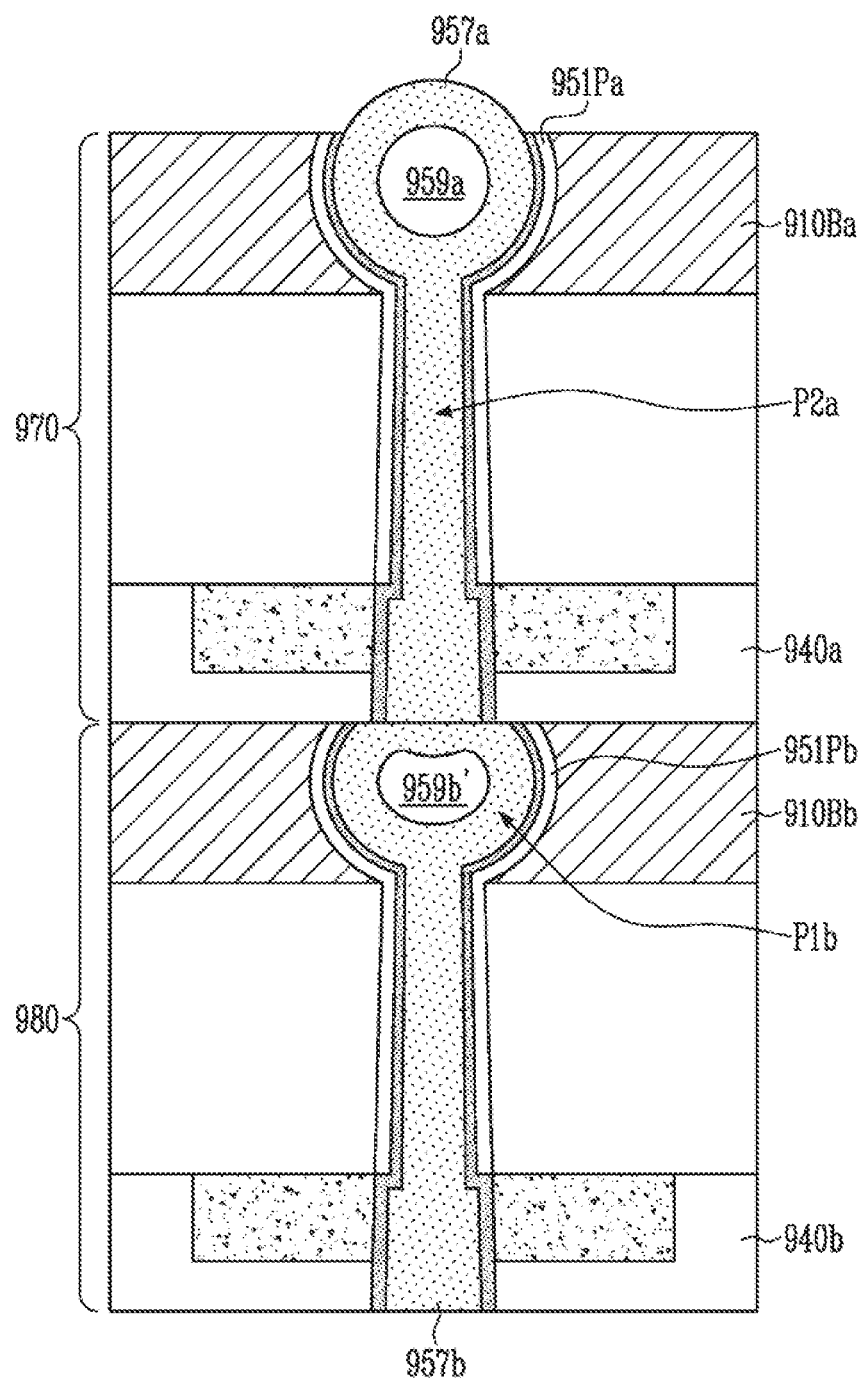

FIGS. 10A and 10B are sectional views illustrating a process of bonding a first semiconductor chip 970 and a second semiconductor chip 980. The bonding process between the first semiconductor chip 970 and the second semiconductor chip 980 may be performed through a bonding process between wafers, be performed through a bonding process between dies, or be performed through a bonding process between a wafer and a die.

Referring to FIG. 10A, the first semiconductor chip 970 and the second semiconductor chip 989 may be respectively penetrated by a first through electrode 957a and a second through electrode 957b, which are manufactured through the processes described with reference to FIGS. 9A to 9J. A first empty gap 959a may be buried in the first through electrode 957a, and a second empty gap 959b may be buried in the second through electrode 957b.

According to the processes described with reference to FIGS. 9A to 9J, the first through electrode 957a may include a first buffer part P1a and a first vertical part P2a extending from the first buffer part P1a. The first buffer part P1a may be disposed in a first buffer hole 947a penetrating a first bonding substrate 910Ba of the first semiconductor chip 970, and surround the first empty gap 959a. The first vertical part P2a may extend to penetrate a first insulating structure 920a, a first conductive pad 930a, and a second insulating structure 940a of the first semiconductor chip 970. A sidewall of the first buffer part P1a, which faces the first bonding substrate 910Ba, and a sidewall of the first vertical part P2a, which faces the first insulating structure 920a, may be surrounded by a first sidewall insulating pattern 951Pa. The first vertical part P2a may farther protrude than the first sidewall insulating pattern 951Pa, and be in contact with the first conductive pad 930a of the first semiconductor chip 970.

According to the processes described with reference to FIGS. 9A to 9J, the second through electrode 957b may include a second buffer part P1b and a second vertical part P2b extending from the second buffer part P1b. The second buffer part P1b may be disposed in a second buffer hole 947b penetrating a second bonding substrate 910Bb of the second semiconductor chip 980, and surround the second air gap 959b. The second vertical part P2b may extend to penetrate a first insulating structure 920b, a second conductive pad 930b, and a second insulating structure 940b of the second semiconductor chip 980. A sidewall of the second buffer part P1b, which faces the second bonding substrate 910Bb, and a sidewall of the second vertical part P2b, which faces the first insulating structure 920b, may be surrounded by a second sidewall insulating pattern 951Pb. The second vertical part P2b may farther protrude than the second sidewall insulating pattern 951Pb, and be in contact with the second conductive pad 930b of the second semiconductor chip 980.

The first buffer part P1a may farther protrude than the first bonding substrate 910Ba, and the second buffer part P1b may farther protrude than the second bonding substrate 910Bb.

The first semiconductor chip 970 may be aligned on the second semiconductor chip 980 such that the first vertical part P2a and the second buffer part P1b face each other.

Referring to FIG. 10B, the first through electrode 957a of the first semiconductor chip 970 may be bonded to the second through electrode 957b of the second semiconductor chip 980. The first through electrode 957a and the second through electrode 957b may be bonded to each other by bonding the first vertical part P2a to the second buffer part P1b.

The bonding process may include a plasma annealing process. The plasma annealing process may be performed at a low temperature of 300° C. or less. During the plasma annealing process, the first through electrode 957a and the second through electrode 957b may be bonded to each other by coherence between metal layers of the first through electrode 957a and the second through electrode 957b.

The metal layer of each of the first through electrode 957a and the second through electrode 957b may thermally expand due to heat generated during the above-described bonding process, and repulsive power may occur between the first through electrode 957a and the second through electrode 957b. A protrusion part of the second through electrode 957b may be recessed to the inside of the second empty gap 959b shown in FIG. 10A by the repulsive power generated between the first through electrode 957a and the second through electrode 957b and the coherence between the metal layers of the first through electrode 957a and the second through electrode 957b. Accordingly, the shape of the second empty gap 959b shown in FIG. 10A may be deformed in the bonding process as shown in FIG. 10B, and remain as a dented empty gap 959b' having a curvature deviation greater than that of the first empty gap 959a. In an embodiment, the dented empty gap 959b' may have a concave portion and a convex portion.

As described above, in accordance with the embodiment of the present disclosure, the repulsive power generated between the metal layers at a bonding interface during the bonding process can be cancelled by a buffering action of the empty gap. Thus, the stability of the bonding structure between the semiconductor chips can be improved.

Although the structure in which the first semiconductor chip 970 and the second semiconductor chip 980 are bonded to each other is exemplified in the above, the number of semiconductor chips bonded to each other in the present disclosure is not limited thereto.

In accordance with the present disclosure, repulsive power between through electrodes due to thermal expansion of the through electrodes during a bonding process can be cancelled through empty gaps formed in the through electrodes. Accordingly, the stability of a bonding structure can be improved.

What is claimed is:

1. A stacked type semiconductor device comprising:
   semiconductor chips stacked to overlap with each other;
   through electrodes respectively penetrating the semiconductor chips, wherein the through electrodes are directly bonded to each other; and
   empty gaps respectively buried in the through electrodes.

2. The stacked type semiconductor device of claim 1, wherein each of the semiconductor chips includes:
   a substrate having a first surface and a second surface opposite to the first surface;
   a first insulating structure on the first surface of the substrate;
   a conductive pad facing the first surface of the substrate with the first insulating structure interposed between the conductive pad and the first surface of the substrate; and
   a second insulating structure covering a surface of the first insulating structure on which the conductive pad is disposed.

3. The stacked type semiconductor device of claim 2, wherein each of the through electrodes includes:
   a contact surface in contact with the conductive pad;
   a first bonding surface adjacent to the second surface of the substrate; and
   a second bonding surface adjacent to a surface of the second insulating structure.

4. The stacked type semiconductor device of claim 1, wherein at least one of the empty gaps is deformed.

5. The stacked type semiconductor device of claim 1, wherein at least one of the empty gaps is a dented empty gaps.

6. A stacked type semiconductor device comprising:
   semiconductor chips stacked to overlap with each other;
   through electrodes respectively penetrating the semiconductor chips, wherein the through electrodes are bonded to each other; and
   empty gaps respectively buried in the through electrodes,
   wherein each of the semiconductor chips includes:
   a substrate having a first surface and a second surface opposite to the first surface;
   a first insulating structure on the first surface of the substrate;
   a conductive pad facing the first surface of the substrate with the first insulating structure interposed between the conductive pad and the first surface of the substrate; and
   a second insulating structure covering a surface of the first insulating structure on which the conductive pad is disposed, and
   wherein each of the through electrodes includes:
   a buffer part disposed in a buffer hole extending toward the second surface from the first surface of the substrate to penetrate the substrate; and
   a vertical part filling a via hole extending to penetrate the first insulating structure, the conductive pad, and the second insulating structure from the buffer hole.

7. The stacked type semiconductor device of claim 6, further comprising a sidewall insulating pattern extending between the first insulating structure and the vertical part and between the buffer part and the substrate,
   wherein the vertical part farther protrudes than the sidewall insulating pattern to be in contact with the conductive pad and the second insulating structure.

8. The stacked type semiconductor device of claim 6, wherein each of the empty gaps is buried in the buffer hole, and is surrounded by the buffer part.

9. The stacked type semiconductor device of claim 6, wherein the through electrodes are electrically connected to each other by a structure in which the vertical part of an upper through electrode and the buffer part of a lower through electrode are bonded to each other.

10. The stacked type semiconductor device of claim 6, wherein the buffer hole has a curved sidewall extending in a stacked direction in which the through electrodes are stacked, and
   wherein the via hole has a flat sidewall extending in the stacked direction.

11. The stacked type semiconductor device of claim 6, wherein the buffer hole has a width wider than that of the via hole.

12. A stacked type semiconductor device comprising:
semiconductor chips stacked to overlap with each other;
through electrodes respectively penetrating the semiconductor chips, wherein the through electrodes are bonded to each other; and
empty gaps respectively buried in the through electrodes, wherein the through electrodes include:
  metal layers respectively surrounding the empty gaps, wherein the metal layers are bonded to each other; and
  barrier layers respectively formed on sidewalls of the metal layers.

13. The stacked type semiconductor device of claim 10, wherein each of the semiconductor chips includes:
  a substrate having a first surface and a second surface opposite to the first surface;
  a first insulating structure on the first surface of the substrate;
  a conductive pad facing the first surface of the substrate with the first insulating structure interposed between the conductive pad and the first surface of the substrate; and
  a second insulating structure covering a surface of the first insulating structure on which the conductive pad is disposed.

14. The stacked type semiconductor device of claim 12, wherein at least one of the empty gaps is deformed.

15. The stacked type semiconductor device of claim 12, wherein at least one of the empty gaps is a dented empty gaps.

* * * * *

UNITED STATES PATENT AND TRADEMARK OFFICE
CERTIFICATE OF CORRECTION

Page 1 of 1

PATENT NO. : 11,244,928 B2
APPLICATION NO. : 16/942290
DATED : February 8, 2022
INVENTOR(S) : Lee It is certified that error appears in the above-identified patent and that said Letters Patent is hereby corrected as shown below:

In the Claims

Column 15 Line 16-Column 16 Line 11 should read:
13. The stacked type semiconductor device of claim 12, wherein each of the semiconductor chips includes:
a substrate having a first surface and a second surface opposite to the first surface;
a first insulating structure on the first surface of the substrate;
a conductive pad facing the first surface of the substrate with the first insulating structure interposed between the conductive pad and the first surface of the substrate; and
a second insulating structure covering a surface of the first insulating structure on which the conductive pad is disposed.

Signed and Sealed this
Twelfth Day of April, 2022

Drew Hirshfeld
*Performing the Functions and Duties of the
Under Secretary of Commerce for Intellectual Property and
Director of the United States Patent and Trademark Office*